(12) United States Patent
Nagata et al.

(10) Patent No.: US 9,199,339 B2
(45) Date of Patent: *Dec. 1, 2015

(54) PB-FREE SOLDER ALLOY

(75) Inventors: Hiroaki Nagata, Tokyo (JP); Takashi Iseki, Tokyo (JP); Jiro Taguchi, Niihama (JP); Masato Takamori, Tokyo (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/805,772

(22) PCT Filed: Jun. 15, 2011

(86) PCT No.: PCT/JP2011/063658
§ 371 (c)(1),
(2), (4) Date: Dec. 20, 2012

(87) PCT Pub. No.: WO2012/002147
PCT Pub. Date: Jan. 5, 2012

(65) Prior Publication Data
US 2013/0094991 A1    Apr. 18, 2013

(30) Foreign Application Priority Data
Jun. 28, 2010   (JP) ................. 2010-146378

(51) Int. Cl.
B23K 35/24    (2006.01)
B23K 35/26    (2006.01)
(Continued)

(52) U.S. Cl.
CPC ............ *B23K 35/24* (2013.01); *B23K 35/262* (2013.01); *B23K 35/264* (2013.01); *C22C 1/02* (2013.01); *C22C 1/04* (2013.01); *C22C 12/00* (2013.01); *H05K 3/3463* (2013.01)

(58) Field of Classification Search
CPC .............................. B23K 35/264; B23K 35/24
USPC .......................................................... 420/577
See application file for complete search history.

(56) References Cited

U.S. PATENT DOCUMENTS

2002/0012608 A1* 1/2002 Takaoka et al. ............... 420/561
2009/0242249 A1* 10/2009 Furusawa et al. ............. 428/642
(Continued)

FOREIGN PATENT DOCUMENTS

FR    2810051    12/2001
JP    H8-215880   8/1996
(Continued)

OTHER PUBLICATIONS

Horiu et al., Machine translation of JP 2005161397 A, Jun. 2005.*
(Continued)

*Primary Examiner* — Roy King
*Assistant Examiner* — Xiaowei Su
(74) *Attorney, Agent, or Firm* — Kratz, Quintos & Hanson, LLP

(57) ABSTRACT

Disclosed herein is a high-temperature Pb-free solder alloy having the strength required to join electronic parts to a substrate and having excellence in wettability and workability. The high-temperature Pb-free solder alloy contains 0.4% by mass or more but 13.5% by mass or less of Zn, 0.05% by mass or more but 2.0% by mass or less of Cu, 0.500% by mass or less of P, and a balance being Bi except for inevitable impurities. The Pb-free solder alloy may further contain 0.03% by mass or more but 0.7% by mass or less of Al.

4 Claims, 1 Drawing Sheet

(51) Int. Cl.
  *C22C 1/02* (2006.01)
  *C22C 1/04* (2006.01)
  *C22C 12/00* (2006.01)
  *H05K 3/34* (2006.01)

(56) References Cited

U.S. PATENT DOCUMENTS

| 2010/0127047 | A1 | 5/2010 | Ho et al. | |
| 2013/0078138 | A1* | 3/2013 | Iseki | 420/577 |

FOREIGN PATENT DOCUMENTS

| JP | H11-77366 | | 3/1999 |
| JP | 2002-160089 | A1 | 6/2002 |
| JP | 2004-25232 | A1 | 1/2004 |
| JP | 2004-528992 | A1 | 9/2004 |
| JP | 2004-533327 | A1 | 11/2004 |
| JP | 2005072173 | A * | 3/2005 |
| JP | 3671815 | B2 | 4/2005 |
| JP | 2005-161397 | A1 | 6/2005 |
| JP | 2005161397 | A * | 6/2005 |
| JP | 2006-167790 | A1 | 6/2006 |
| JP | 2007-181880 | A1 | 7/2007 |
| JP | 2007-281412 | A1 | 10/2007 |
| JP | 2007-313526 | A1 | 12/2007 |
| WO | 02/101105 | | 12/2002 |
| WO | WO 2007/136009 | A1 | 11/2007 |
| WO | WO 2009/084155 | A1 | 7/2009 |

OTHER PUBLICATIONS

Machine translation of JP2005072173A. Mar. 2005.*
International Search Report for International Application No. PCT/JP2011/063658 dated Jul. 26, 2011.
German Office Action dated Jul. 30, 2013 issued in counterpart application No. 11 2011 102 163.1 with English translation.

* cited by examiner

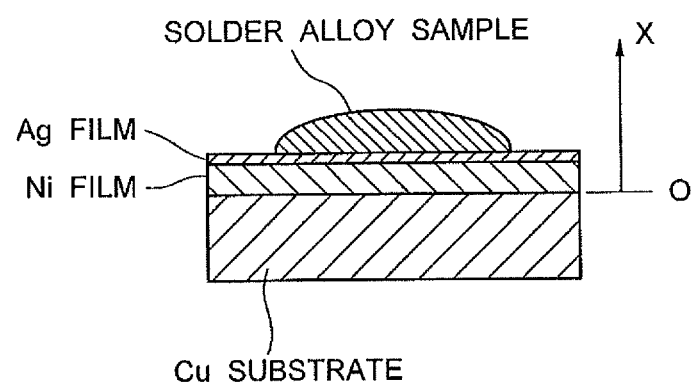

PB-FREE SOLDER ALLOY

TECHNICAL FIELD

The present invention relates to a Pb-free solder alloy containing no lead. More particularly, the present invention relates to a high-temperature Pb-free solder alloy and an electronic circuit board using the Pb-free solder alloy for joining.

BACKGROUND ART

In recent years, restrictions on chemical substances harmful to the environment have become increasingly stringent, and the restrictions on solder materials used to join electronic parts or the like to a substrate are no exceptions. Pb (lead) has been used as a major component of solder materials since old times, but has already been designated as a restricted substance by, for example, RoHS Directive. Therefore, solders containing no Pb (hereinafter, also referred to as "Pb-free solders") have been actively developed.

Solders used to join electronic parts to a substrate are broadly divided into high-temperature solders (about 260 to 400° C.) and low- and medium-temperature solders (about 140 to 230° C.) based on their service temperature limits. As for low- and medium-temperature solders, Pb-free solders mainly containing Sn have already been practically used. For example, Patent Document 1 discloses a Pb-free solder alloy composition containing Sn as a major component, 1.0 to 4.0% by mass of Ag, 2.0% by mass or less of Cu, 0.5% by mass or less of Ni, and 0.2% by mass or less of P. Further, Patent Document 2 discloses a Pb-free solder alloy composition containing 0.5 to 3.5% by mass of Ag, 0.5 to 2.0% by mass of Cu, and the balance Sn.

On the other hand, high-temperature Pb-free solder materials also have been developed in various organizations. For example, Patent Document 3 discloses a Bi/Ag brazing filler material containing 30 to 80% by mass of Bi and having a melting temperature of 350 to 500° C. Further, Patent Document 4 discloses a solder alloy obtained by adding a binary eutectic alloy to an eutectic alloy containing Bi and by further adding an additive element thereto, and describes that this solder alloy is a quaternary or higher solder, that is, a multi-component solder, but it is possible to adjust its liquidus-line temperature and to reduce variations in composition.

Patent Document 5 discloses a solder alloy obtained by adding Cu—Al—Mn, Cu, or Ni to Bi, and describes that when such a solder alloy is used to join a power semiconductor device having a Cu surface layer to an insulator substrate having a Cu surface layer, an undesired reaction product is less likely to be formed at a joint interface between the solder and each of the Cu layers so that the occurrence of defects such as cracks can be suppressed.

Patent Document 6 discloses a solder composition containing, based on the total mass of the solder composition, 94.5% by mass or more of Bi as a first metal element, 2.5% by mass of Ag as a second metal element, and a total of 0.1 to 3.0% by mass of at least one selected from the group consisting of 0.1 to 0.5% by mass of Sn, 0.1 to 0.3% by mass of Cu, 0.1 to 0.5% by mass of In, 0.1 to 3.0% by mass of Sb, and 0.1 to 3.0% by mass of Zn as a third metal element.

Patent Document 7 discloses a Pb-free solder composition containing a Bi-based alloy containing at least one of Ag, Cu, Zn, and Sb as an accessory component and 0.3 to 0.5% by mass of Ni, and describes that this Pb-free solder has a solidus-line temperature of 250° C. or higher and a liquidus-line temperature of 300° C. or less. Further, Patent Document 8 discloses a binary alloy containing Bi, and describes that this binary alloy has the effect of suppressing the occurrence of cracks in the inside of a soldering structure.

Patent Document 9 discloses a Bi alloy having a melting temperature of 270° C. or higher and containing 0.2 to 0.8% by mass of Cu and 0.2 to 0.02% by mass of Ge. Patent Document 10 discloses a Bi alloy having a solidus-line temperature of at least 260° C. and containing 2 to 18% by mass of Ag. Patent Document 11 discloses a Bi alloy having a solidus-line temperature of 262.5° C. or higher and containing 82 to 98% by mass of Bi.

PRIOR ART DOCUMENTS

Patent Documents

Patent Document 1: Japanese Patent Application Kokai No. 11-077366
Patent Document 2: Japanese Patent Application Kokai No. 8-215880
Patent Document 3: Japanese Patent Application Kokai No. 2002-160089
Patent Document 4: Japanese Patent Application Kokai No. 2006-167790
Patent Document 5: Japanese Patent Application Kokai No. 2007-281412
Patent Document 6: Japanese Patent No. 3671815
Patent Document 7: Japanese Patent Application Kokai No. 2004-025232
Patent Document 8: Japanese Patent Application Kokai No. 2007-181880
Patent Document 9: Japanese Patent Application Kokai No. 2007-313526
Patent Document 10: Japanese patent Application Kohyo No. 2004-533327
Patent Document 11: Japanese patent Application Kohyo No. 2004-528992

DISCLOSURE OF THE INVENTION

Problems to be Solved by the Invention

As described above, high-temperature Pb-free solder materials have been developed by various organizations, but in fact, solder materials having properties fully satisfactory for practical use have not yet been found.

In general, materials having relatively low upper temperature limits, such as thermoplastic resins and thermosetting resins, are often used for electronic parts and substrates, and therefore a working temperature needs to be less than 400° C., preferably 370° C. or less. However, in the case of, for example, the Bi/Ag brazing filler material disclosed in Patent Document 3, its liquidus-line temperature is as high as 400 to 700° C., and therefore it is estimated that a working temperature during joining is 400 to 700° C. or higher. In this case, the working temperature exceeds the upper temperature limits of electronic parts or substrates to be joined.

High-temperature solders are generally required to have properties such as high solidus-line temperature, moderate liquidus-line temperature, high durability against repeated heating/cooling cycles, good thermal stress relaxation properties, and good wetting and spreading properties. The solder alloys mainly containing Bi need to solve problems specific to Bi-based solders in addition to having the above mentioned properties.

More specifically, Bi-based solders have a problem in that they have brittle mechanical properties. Further, when an electronic part has a Ni surface layer to enhance its joinability with a solder, there is a case where the Ni layer rapidly reacts with Bi contained in the solder to form a brittle alloy of Ni and Bi, and diffusion of Ni into Bi occurs due to breakage or separation of the Ni layer so that joint strength is significantly reduced. There is a case where a Ag or Au layer is provided on the Ni layer, but in this case, the Ag or Au layer is provided for the purpose of preventing oxidation of the Ni layer or improving wettability, and therefore the Ag or Au immediately diffuses into the solder alloy and hardly has the effect of suppressing the Ni diffusion.

In spite of that, Patent Document 4 does not disclose any means for solving the problem of such diffusion of Ni into a Bi-based solder, and does not describe any measures to improve the brittle mechanical properties of a Bi-based solder, either.

In Patent Document 5, there is a description about comparative examples in which a surface layer to be joined with a solder is not formed of a Cu layer but formed of a Ni layer. More specifically, Patent Document 5 describes that the solder obtained by adding Cu—Al—Mn, Cu, or Ni to Bi produces a large amount of $Bi_3Ni$ at a joint interface and many voids are observed around it. Patent Document 5 also describes that it has been confirmed that the $Bi_3Ni$ is very brittle and it is difficult to achieve high reliability under severe conditions where heat cycles are repeated. Patent documents 6 to 11 do not at all describe measures to prevent diffusion of Ni into Bi.

As described above, in the case of Pb-free solders mainly containing Bi, it is necessary to prevent the diffusion of Ni from Ni layers provided in electronic parts into Bi as well as to improve mechanical properties, because otherwise the Bi-based solders cannot have the strength required to join electronic parts to a substrate and therefore cannot be practically used.

It is therefore an object of the present invention to provide a Bi-based solder alloy which virtually has a solidus temperature of 260° C. or higher and therefore can be used as a high-temperature solder alloy and which can overcome problems specific to Bi-based solders, that is, to improve brittle mechanical properties and to suppress diffusion of Ni into Bi.

Means for Solving the Problems

In order to achieve the above object, the present invention provides a Pb-free solder alloy consisting of: 0.4% by mass or more but 13.5% by mass or less of Zn, 0.05% by mass or more but 2.0% by mass or less of Cu, and 0.500% by mass or less of P, and a balance being Bi except for inevitable impurities. The Pb-free solder alloy of the present invention may further include 0.03% by mass or more but 0.7% by mass or less of Al. Furthermore, the present invention provides an electronic circuit board having electronic parts joined thereto by using the Pb-free solder alloy.

Effects of the Invention

According to the present invention, it is possible to provide a high-temperature Pb-free solder alloy having the strength required to joint electronic parts to a substrate and having excellence in wettability and workability. More specifically, by adding Zn and Cu as essential elements to a main component of Bi in such a manner as to achieve the predetermined Zn content and Cu content, it is possible to provide a Bi-based solder alloy which has excellence in wettability and workability and which virtually has resistance to a reflow temperature of 260° C. or more and which has capabilities of suppressing the reaction between Bi contained therein and Ni layers provided in electronic parts or the like and suppressing the diffusion of Ni into Bi-based solder. The use of such a Bi-based solder alloy makes it possible to significantly enhance the reliability of Pb-free soldering at high temperature, which significantly contributes to industry.

BRIEF DESCRIPTION OF THE DRAWING

FIG. 1 is a sectional view of a Cu substrate having a Ni film, and a solder alloy samples of an example applied thereto.

BEST MODE FOR CARRYING OUT THE INVENTION

High-temperature Pb-free solder alloys generally need to withstand a reflow temperature of about 260° C. Further, when they are Bi-based solders, it is necessary to suppress the reaction between Bi and Ni and to suppress the diffusion of Ni into Bi. If this is inadequate, there is a possibility that Ni layers generally provided in electronic parts or the like react with Bi contained in a solder so that a brittle Bi—Ni alloy is formed and joints become brittle due to the diffusion of Ni into Bi. As a result, joint strength is reduced, thereby reducing the reliability of a device having an electronic circuit board using the solder alloy for joining.

The present inventors have studied the reactivity between Ni and other various elements, and they have found that Zn preferentially reacts with a Ni layer as compared with Bi and forms an alloy. The present inventors have also found that, in the case of a binary alloy obtained by adding only Zn to Bi, workability can be ensured to some extent, but wettability becomes poor due to the strong reducing properties of Zn, which reduces joinability.

The present inventors have also found that addition of various elements to the Bi—Zn alloy that is a base material is effective to improve workability and wettability as well as to suppress Ni diffusion. For example, it has been confirmed that addition of Cu is very effective to improve solder reliability, that is, strength and durability against repeated heat cycles and such an effect is enhanced by further adding Al.

Addition of Cu improves wettability to some extent, but in order to further improve wettability, formation of an oxide film or the like on solder surface needs to be controlled. The present inventors have found that addition of P is effective as measures against it. Hereinbelow, each of the elements mentioned above providing characteristic effects will be described, which are contained or optionally contained in a Pb-free solder alloy according to the present invention. In addition, an element that must not be contained in the Pb-free solder alloy according to the present invention except for inevitable impurities will be described.

<Bi>

Bi is a primary element, that is, a main component of the high-temperature Pb-free solder alloy according to the present invention. Bi belongs to Va Group (including N, P, As, Sb, Bi) and is a very brittle metal having a trigonal (rhombohedral) crystal structure with low symmetry. By performing a tensile test or the like on Bi, its brittle fracture surface is easily observed. That is, pure Bi is a metal poor in ductility.

In order to overcome such brittleness of Bi, various elements which will be described below are added. The type and amount of elements to be added depend on which of the various properties of Bi (e.g., brittleness) is improved and how much improvement is desired. Therefore, the Bi content of the solder alloy inevitably varies depending on the type and amount of element to be added. It is to be noted that the reason why Bi is selected among elements belonging to Va Group is that elements belonging to Va Group other than Bi are classified as semimetals or nonmetals and are more brittle than Bi. Further, Bi has a melting point of 271° C. which is higher than a reflow temperature of about 260° C. at which high-temperature solders are used.

<Zn>

Zn is an essential element to be added to the high-temperature Pb-free solder alloy according to the present invention. Addition of Zn to Bi makes it possible to overcome brittleness and improve workability due to the solid solution of Zn in Bi. In a case where Zn is added in an amount larger than that at the eutectic point between Zn and Bi, a larger amount of Zn-rich phase appears so that workability is further improved.

Further, addition of Zn makes it possible to obtain important effects, that is, suppression of the reaction between Bi and Ni and suppression of the diffusion of Ni into a Bi-based solder. The reason why such effects can be obtained is because Zn has higher reactivity with Ni than Bi and therefore a thin Zn—Ni layer is formed on the surface of a Ni layer and this Zn—Ni layer acts as a barrier to suppress the reaction between Ni and Bi. This prevents the formation of a brittle Bi—Ni alloy and prevents the diffusion of Ni into Bi, thereby achieving high joinability.

The optimum amount of Zn contained in the solder alloy to provide such excellent effects is generally 0.4% by mass or more but 13.5% by mass or less, which depends on, for example, the thickness of a Ni layer, reflow temperature, and reflow time. If the Zn content is less than 0.4% by mass, the effect of suppressing the Ni diffusion is inadequate or Zn is consumed to suppress Ni diffusion and therefore good workability cannot be obtained.

On the other hand, if the Zn content exceeds 13.5% by mass, the liquidus-line temperature of the solder alloy exceeds 400° C., which makes it impossible to achieve successful joining. Addition of an appropriate amount of Al (which will be described later) to the solder alloy containing Zn in an amount within the above range makes it possible to further improve the workability of the Zn-rich phase, thereby further enhancing the effect obtained by adding Zn.

<Cu>

Cu is an essential element to be added to the high-temperature Pb-free solder alloy according to the present invention. By adding Cu, an intermetallic compound of Zn and Cu is formed. The Zn—Cu intermetallic compound is finely dispersed in Bi to finely crystallize the master alloy, and also plays a role as a filler to improve strength and workability. That is, addition of Cu is expected to have the effect of improving brittleness of Bi due to structural refinement and the effect of the Zn—Cu intermetallic compound as a filler. An improvement in the brittleness of the solder of course leads to an improvement in joint strength and to a significant improvement in durability against repeated heat cycles. This significantly improves the joint reliability of the solder.

In a case where the surface of a base material to which the solder is to be joined is made of Cu, addition of Cu to the solder makes it possible to achieve good wettability because the solder and the surface contain the same metal. Even when the surface of a base material to which the solder containing Cu is to be joined is made of Ni, good wettability can be obtained as in the above case. In this case, however, it is considered that the reason for this is that the solder matrix becomes less likely to be oxidized because Cu is less likely to be oxidized.

The amount of Cu contained in the solder alloy is determined in consideration of characteristics such as workability and wettability as well as the amount of solid solution of Cu in, for example, Bi. More specifically, the Cu content is 0.05% by mass or more but 2.0% by mass or less, and is preferably 0.05% by mass or more but less than 1.0% by mass from the viewpoint of further enhancing the above-described effects. If the Cu content exceeds 2.0% by mass, segregation of Cu having a high melting point occurs, thereby causing a problem such as reduction in joinability.

On the other hand, it has been confirmed that if the Cu content is less than 0.05% by mass (lower limit), virtually no desired effect of improving workability or wettability is obtained. It is to be noted that the Cu content is not very large with respect to the total mass of the solder alloy as long as it is in the range of 0.05% by mass or more but 2.0% by mass or less, and therefore other properties required for the solder are not adversely affected.

<Al>

Al is an element to be added when workability or wettability needs to be further improved. The reason why wettability is improved by adding Al is because Al itself is oxidized due to its strong reducing properties and therefore oxidation of the solder matrix can be suppressed by adding only a small amount of Al. On the other hand, the reason why workability is improved by adding Al can be described based on the following two mechanisms.

The first mechanism is the same as that described above with reference to a case where Cu is added. More specifically, an intermetallic compound of Zn and Al is formed by adding Al, and the Zn—Al intermetallic compound is finely dispersed in Bi to finely crystallize the master alloy and also plays a role as a filler. This improves the strength and workability of the solder alloy. That is, brittleness of Bi is improved by structural refinement and the effect of the intermetallic compound as a filler.

The second mechanism is as follows. Zn and Al form an alloy, and particularly, refinement of the alloy having about a Zn—Al eutectic composition improves workability. As described above, workability-improving effect obtained by adding Al is based on the two different mechanisms. When Al is added, the optimum Al content of the solder alloy is 0.03% by mass or more but 0.7% by mass or less. If the Al content is less than 0.03% by mass, it is too small, and particularly, it cannot be said that it is enough for applications requiring workability. On the other hand, if the Al content exceeds 0.7% by mass, the melting point of the solder alloy becomes too high or segregation of Al occurs. Further, the composition of the Zn—Al alloy deviates from its eutectic composition, which makes it impossible for Al to exhibit its workability-improving effect.

It is preferred that Al is not added when the solder contains one or both of the above-described Zn and Cu in an amount(s) near its or their allowable upper limit(s). This is because when the solder contains Zn or Cu in an amount near its upper limit, the solder already has a very high liquidus temperature, and therefore if Al having a high melting point is further added, the liquidus temperature becomes too high and successful joining cannot be achieved.

<P>

P is an element to be added if necessary. Addition of P makes it possible to further improve the wettability and joinability of the Bi—Zn—Cu alloy. This effect is also exhibited when Al is added. The reason why wettability-improving effect is enhanced by adding P is because P itself is oxidized due to its strong reducing properties and therefore oxidation of the surface of the solder alloy is suppressed. Particularly, in the present invention, there is a case where Zn that is easily oxidized is added to be richer in Zn content than 2.7% by mass that is the eutectic point of a Zn—Bi alloy, and therefore addition of P is very effective to improve wettability.

Addition of P further has the effect of reducing the occurrence of voids during joining. This is because, as described above, P itself is easily oxidized and therefore P is preferentially oxidized over Bi, which is a main component of the solder, and Zn during joining. This makes it possible to suppress the oxidation of the solder matrix and ensure wettability. As a result, successful joining is achieved and voids are less likely to occur.

As described above, P has very strong reducing properties, and therefore addition of P has the effect of improving wettability even when the amount of P added is very small. On the other hand, the wettability-improving effect of P is not enhanced when the P content of the solder alloy exceeds a certain level. If P is excessively added, there is a possibility that an oxide of P is formed on the surface of the solder or P forms a brittle phase so that the solder becomes brittle. For this reason, it is preferred that p is added in a very small amount.

More specifically, P is preferably added so that the P content of the solder alloy becomes 0.001% by mass or more. The upper limit of the P content is 0.500% by mass. If the P content exceeds the upper limit, there is a possibility that the surface of the solder is covered with an oxide of P so that wettability is reduced. Further, the solid solution amount of P in Bi is very small, and therefore if the P content is large, reliability is reduced due to, for example, segregation of a brittle oxide of P. In this regard, it has been confirmed that particularly when the solder is processed into wire or the like, segregation of a brittle oxide of P is likely to cause a break. On the other hand, if the P content is less than 0.001% by mass, it makes no sense to add P because a desired reduction effect cannot be obtained.

<Ag>

The high-temperature Pb-free solder alloy according to the present invention does not contain Ag. This makes it possible to suppress the reaction between Ni and Bi and to suppress the diffusion of Ni into a Bi-based solder. The reason for this is as follows. Ag has excellent wettability and is highly reactive with Ni layers of electronic parts or the like. Therefore, if Ag is contained, reaction is more likely to proceed as compared to a case where reaction occurs only between Bi and Ni so that the reaction between Bi and Ni is promoted and Ni diffusion also easily proceeds. It is to be noted that such an influence of Ag particularly becomes conspicuous when Ag is contained in an amount of 0.4% by mass or more.

In this regard, Patent Document 6 describes Ag, Cu, Zn or the like which is a second metal element that can form a binary eutectic alloy consisting of 90 parts by weight or more of Bi and 9.9 parts by weight or less of the second metal element. However, the action of Ag and the action of Zn on the reaction between Bi and Ni are completely opposite, and therefore there is no possibility that Ag and Zn perform the same function as a second metal element. That is, as described above, Zn has the important effect of suppressing the reaction between Ni and Bi and suppressing the diffusion of Ni into Bi, whereas Ag has the effect of promoting the reaction between Ni and Bi. For this reason, the solder alloy according to the present invention does not contain Ag.

The use of the above-described high-temperature Pb-free solder alloy according to the present invention to joint electronic parts to a substrate makes it possible to provide electronic circuit boards having high durability and reliability even when used under severe conditions, e.g., in an environment where heat cycles are repeated. By incorporating such electronic circuit boards into devices to be used under severe conditions such as power semiconductor devices (e.g., thyristors, inverters), various control units for automobiles and the like, and solar cells, the reliability of these devices can be further improved.

EXAMPLES

Hereinbelow, the present invention will be described more specifically with reference to the following example, but the present invention is not limited to this example.

First, as raw materials, Bi, Zn, Cu, Al, P, and Ag each having a purity of 99.99% by mass or higher were prepared. Large flaky or bulky raw materials were cut or ground into small pieces of 3 mm or less so that the composition of a molten alloy was made uniform without variations according to sampling site. Then, predetermined amounts of these raw materials were weighed and placed in a graphite crucible for high-frequency melting furnace. In the case of a high-melting-point metal that does not easily melt, an alloy was previously formed by melting the high-melting-point metal and a metal having high solid solubility, and then the alloy was ground and remelted.

The crucible containing the raw materials was placed in a high-frequency melting furnace, and nitrogen was allowed to flow at a flow rate of 0.7 L/min or more per kilogram of the raw materials to suppress oxidation. In this state, the melting furnace was turned on to melt the raw materials by heating. When the metals started to melt, they were well mixed under stirring with a mixing stick so that the composition of a molten metal was made uniform without local variations. After it was confirmed that the metals were fully melted, the high-frequency melting furnace was turned off, and the crucible was immediately taken out of the melting furnace and the molten metal in the crucible was poured into a mold for a solder master alloy. As the mold, one having the same form as that generally used for producing a solder alloy was used.

Solder master alloys different in the mixing ratio among these raw materials were prepared in such a manner as described above as samples 1 to 20. The compositions of these solder master alloy samples 1 to 20 were analyzed by an ICP emission spectrometer (SHIMAZU S-8100). The results of analysis are shown in the following Table 1.

TABLE 1

| | Solder Composition (% by mass) | | | | | |
|---|---|---|---|---|---|---|
| Samples | Bi | Zn | Cu | Al | P | Ag |
| 1 | Balance | 0.51 | 0.81 | — | — | — |
| 2 | Balance | 6.56 | 0.80 | — | — | — |
| 3 | Balance | 13.1 | 0.82 | — | — | — |
| 4 | Balance | 3.12 | 0.09 | — | — | — |
| 5 | Balance | 3.08 | 0.96 | — | — | — |
| 6 | Balance | 3.02 | 1.92 | — | — | — |
| 7 | Balance | 3.05 | 0.83 | 0.07 | — | — |
| 8 | Balance | 3.07 | 0.78 | 0.67 | — | — |
| 9 | Balance | 3.03 | 0.82 | — | 0.006 | — |
| 10 | Balance | 3.01 | 0.79 | — | 0.492 | — |
| 11 | Balance | 2.98 | 0.83 | 0.21 | 0.007 | — |
| 12 | Balance | 3.03 | 0.80 | 0.23 | 0.489 | — |
| 13* | Balance | 0.14 | 0.77 | — | — | — |
| 14* | Balance | 18.1 | 0.79 | — | — | — |
| 15* | Balance | 13.2 | 0.02 | — | — | — |
| 16* | Balance | 13.1 | 4.51 | — | — | — |
| 17* | Balance | 12.9 | 1.89 | 2.31 | — | — |
| 18* | Balance | 3.02 | 0.78 | 0.32 | 1.069 | — |
| 19* | Balance | 3.04 | 0.82 | 0.33 | 0.105 | 2.50 |
| 20* | Balance | 12.9 | 0.81 | 0.31 | 0.102 | 2.50 |

(Note)
Samples marked with * are comparative examples.

Then, the solder master alloy samples 1 to 20 shown in the above Table 1 were subjected to wettability (joinability) evaluation, EPMA line analysis (for evaluation of Ni diffusion-preventing effect), and heat cycle test which will be described later. It is to be noted that the evaluation of solder wettability does not usually depend on the shape of solder, and therefore a solder to be evaluated may be formed into any shape such as a wire, ball, or paste. However, in this example, the Samples 1 to 20 to be evaluated were formed into balls by atomization (which will be described below).

(Molding into Balls by Atomization)

Atomization may be performed either in a gas phase or a liquid phase. In the case of liquid atomization, high-quality balls are easily obtained because the temperature of a liquid can be adjusted according to the type of metal used. Particularly, oil is preferably used as a liquid. This is because a wide adjustable temperature range can be achieved and the molten solder master alloy can be solidified while cooled slowly.

The slow cooling of the molten solder master alloy makes it possible to prevent the formation of projections on ball surfaces and the significant deformation of balls due to expansion of Bi during solidification, thereby significantly increasing the sphericity of balls. On the other hand, if the molten solder master alloy is rapidly cooled, the ratio of balls having surface projections to the total number of balls becomes higher, thereby causing a problem such as reduction in yield. As a heater for melting metals, a high-frequency melting heater is preferred from the viewpoint of quick heat-melting and ease of temperature control. Hereinbelow, oil atomization using a high-frequency melting heater will be described.

First, oil in an atomization apparatus was heated to a predetermined temperature according to the type of metal to be atomized. The Pb-free solder alloy according to the present invention mainly contains Bi, and therefore the predetermined temperature was set to about 280° C. slightly higher than the melting point of Bi. Then, each of the solder master alloy samples prepared in such a manner as described above was charged into a nozzle, and the nozzle was attached to the atomization apparatus. Then, a tool for supplying compressed gas was further attached to the upper end of the nozzle.

Then, the heater was turned on to heat the solder master alloy to 750° C. at a temperature rise rate of 200° C./min to melt it. The heating holding time after the temperature of the solder master alloy reached about 750° C. was set to about 10 minutes to completely melt the solder master alloy to be atomized and to prevent the occurrence of segregation. When the solder master alloy had a high melting point, the heating holding time was appropriately adjusted to be longer.

After the solder master alloy was sufficiently heated to completely melt it, the tip cover of the nozzle was opened, and at the same time, pressure was applied to the molten solder master alloy by an inert gas to discharge it from the nozzle. It is to be noted that the pressure at which the solder master alloy was discharged was set to 15 kPa. The discharge pressure was controlled to lie within the range of 15.0±0.3 kPa to ensure stable discharge conditions. This is because if the discharge pressure is too low, there is a case where the molten solder master alloy cannot be discharged due to clogging, and on the other hand if the discharge pressure is too high, the molten solder master alloy is significantly distorted so that deformed balls are formed.

After the completion of discharge, a valve provided at the bottom of the apparatus was opened to collect balls together with part of the oil. The collected balls were washed to remove the large amount of oil adhering to them. The metal balls were washed by performing decantation seven times using a highly-volatile alcohol as a washing liquid to prevent oxidation. The amount of alcohol used at one time per kilogram of the sample was 500 cc. The sample and the alcohol were placed in a container, well stirred, and filtered. After the completion of washing and filtration, the metal balls were quickly placed in a drier and dried to prevent the process of oxidation. The drying was performed in a vacuum to prevent oxidation. The drying time was set to 3 hours.

<Wettability (Joinability) Evaluation>

Wettability (joinability) evaluation was performed using the above-described solder alloy balls. First, a wettability tester (device name: atmosphere control-type wettability tester) was activated, a heater unit to be heated was doubly covered, and nitrogen was allowed to flow from four points around the heater unit (flow rate of nitrogen at each point: 12 L/min). Then, the heater was heated. The preset temperature of the heater was 340° C.

After the temperature of the heater became stable at 340° C., a Cu substrate (thickness: about 0.70 mm) having a Ni film (thickness: 1.3 to 1.6 μm) and an Ag film (thickness: 0.1 μm) provided on the Ni film was set in the heater unit and heated for 25 seconds. Then, the solder alloy was placed on the Cu substrate and heated for 25 seconds while being spread into a circular shape by a glass stick with stirring. After the completion of heating, the Cu substrate was removed from the heater unit and once transferred to a space adjacent to the heater unit kept under nitrogen atmosphere for cooling. After being sufficiently cooled, the Cu substrate was transferred into the atmosphere to observe a joint.

As a result of the observation, evaluation was performed according to the following criteria.

poor: Successful joining was not achieved.

average: Successful joining was achieved but wetting and spreading properties were poor (a mound of the solder was observed).

good: Successful joining was achieved and wetting and spreading properties were good (the solder was thinly wet-spread). Samples rated as "good" were further subjected to wettability evaluation in the same manner as described above except that stirring with a glass stick was not performed. As a result, samples that were thinly wet-spread without stirring with a glass stick were rated as "very good".

<EPMA Line Analysis (for Evaluation of Ni Diffusion-Preventing Effect)>

EPMA line analysis was performed to determine whether or not problems such as reduction in the thickness of a Ni film provided on a Cu substrate due to reaction with Bi and diffusion of Ni into Bi had occurred. It is to be noted that this analysis was performed using a Cu substrate having the solder alloy joined thereto, and the Cu substrate was prepared in the same manner as in the above-described wettability evaluation. First, a Cu substrate having the solder alloy joined thereto was prepared in the same manner as in the wettability evaluation, embedded in a resin, polished using a polisher by changing polishing paper from coarse one to fine one, and finally buffed. Then, line analysis was performed using EPMA (device name: SHIMADZU EPMA-1600) to examine Ni diffusion, etc.

In measurement, the cross section of the Cu substrate having the solder alloy joined thereto was observed from the side, wherein the joint surface between the Cu substrate and the Ni film was defined as an origin point "O" and a direction from the origin point toward the solder was defined as a plus direction along an X axis (see FIG. 1). Measurement was performed at five random points, and the most average result was evaluated according to the following criteria.

poor: The thickness of the Ni film was reduced by 10% or more due to reaction or Ni was diffused in the solder in the form of a layer.

good: The thickness of the Ni film was hardly changed from its initial value, and Ni was not diffused in the solder.

<Heat Cycle Test>

A heat cycle test was performed to evaluate solder joint reliability. It is to be noted that this test was performed using a Cu substrate having the solder alloy joined thereto, and the Cu substrate was obtained in the same manner as in the above-described wettability evaluation. First, a Cu substrate having the solder alloy joined thereto was subjected to a predetermined number of cooling and heating cycles, where each cycle consists of cooling at −50° C. and heating at 125° C.

Then, the Cu substrate having the solder alloy joined thereto was embedded in a resin, and its cross section was polished to observe a joint surface with a SEM (device name: HITACHI S-4800). Evaluation was performed according to the following criteria.

poor: Peeling was observed at the joint surface or cracks were observed in the solder.

good: Such defects were not observed and the joint surface was maintained in its initial state. The evaluation and test results are shown in Table 2.

TABLE 2

| Samples | Wettability | Evaluation for Ni diffusion | Heat Cycle Test (times) 100 | 200 | 300 |
|---|---|---|---|---|---|
| 1 | very good | good | good | good | good |
| 2 | very good | good | good | good | good |
| 3 | very good | good | good | good | good |
| 4 | very good | good | good | good | good |
| 5 | very good | good | good | good | good |
| 6 | good | good | good | good | good |
| 7 | very good | good | good | good | good |
| 8 | very good | good | good | good | good |
| 9 | very good | good | good | good | good |
| 10 | very good | good | good | good | good |
| 11 | very good | good | good | good | good |
| 12 | very good | good | good | good | good |
| 13* | good | poor | poor | — | — |
| 14* | poor | — | — | — | — |
| 15* | average | good | poor | — | — |
| 16* | average | good | poor | — | — |
| 17* | poor | — | — | — | — |
| 18* | poor | — | — | — | — |
| 19* | average | poor | poor | — | — |
| 20* | average | poor | poor | — | — |

(Note)
Samples marked with * are comparative examples.

As can be seen from the above Table 2, the solder master alloy samples 1 to 12 satisfying the requirements of the present invention achieved good results in all the evaluation tests. More specifically, the samples 1 to 12 had good wettability, and particularly, the samples 1 to 5 and the samples 7 to 12 had excellent wettability because they were thinly wet-spread without stirring with a glass stick. Further, diffusion of Ni into Bi did not occur, and no defects occurred in the heat cycle test even when 300 heat cycles were performed.

On the other hand, the solder master alloy samples 13 to 20 as comparative examples not satisfying the requirements of the present invention achieved a poor result in at least one of the evaluation tests. More specifically, the samples 14, 17, and 18 could not be joined to the Cu substrate, and the samples 15, 16, 19, and 20 had poor wetting and spreading properties. Further, in the case of the sample 13 and the samples 19 and 20 containing Ag, diffusion of Ni into Bi occurred. The samples 13, 15, 16, 19, and 20 were subjected to the heat cycle test, but defects were observed in all the cases when 100 heat cycles were performed.

The invention claimed is:

1. A Pb-free Solder alloy consisting of: at least 0.4% by mass and at most 13.5% by mass of Zn, at least 0.05% by mass and at most 0.83% by mass of Cu, and at least 0.001% by mass and at most 0.500% by mass of P, and a balance being Bi except for inevitable impurities.

2. A Pb-free solder consisting of: at least 0.4% by mass and at most 13.5% by mass of Zn, at least 0.05% by mass and at most 0.83% by mass of Cu, at least 0.001% by mass and at most 0.500% by mass of P, and at least 0.03% by mass and at most 0.7% by mass of Al, and a balance being Bi except for inevitable impurities.

3. An electronic circuit board having electronic parts joined thereto by using the Pb-free solder alloy according to claim 1.

4. An electronic circuit board having electronic parts joined thereto by using the Pb-free alloy according to claim 2.

\* \* \* \* \*